(12) United States Patent
Meltzer

(10) Patent No.: US 7,082,178 B2
(45) Date of Patent: Jul. 25, 2006

(54) LOCK DETECTOR CIRCUIT FOR DEJITTER PHASE LOCK LOOP (PLL)

(75) Inventor: David Meltzer, Wappingers Falls, NY (US)

(73) Assignee: Seiko Epson Corporation, Tokyo (JP)

( * ) Notice: Subject to any disclaimer, the term of this patent is extended or adjusted under 35 U.S.C. 154(b) by 957 days.

(21) Appl. No.: 10/016,915

(22) Filed: Dec. 14, 2001

(65) Prior Publication Data

US 2003/0112915 A1    Jun. 19, 2003

(51) Int. Cl.
*H03D 3/24* (2006.01)

(52) U.S. Cl. ............... 375/376; 375/375; 375/374; 331/DIG. 2

(58) Field of Classification Search ............... 375/375, 375/376, 377, 374, 327, 373; 331/16, 17, 331/DIG. 2; 326/63, 68, 73; 327/156
See application file for complete search history.

(56) References Cited

U.S. PATENT DOCUMENTS

| | | | | |
|---|---|---|---|---|
| 4,366,478 A | * | 12/1982 | Masuda et al. ............ | 340/825 |
| 4,499,434 A | * | 2/1985 | Thompson ................ | 331/17 |
| 4,590,602 A | * | 5/1986 | Wolaver ................... | 375/375 |
| 4,736,167 A | | 4/1988 | Kojima et al. ............ | 331/17 |
| 4,818,950 A | | 4/1989 | Ranger .................... | 328/155 |
| 5,151,665 A | | 9/1992 | Wentzler .................. | 331/8 |
| 5,157,354 A | | 10/1992 | Saiki et al. ............... | 331/1 A |
| 5,216,302 A | | 6/1993 | Tanizawa .................. | 307/603 |
| 5,359,727 A | | 10/1994 | Kurita et al. ............. | 395/550 |
| 5,382,923 A | | 1/1995 | Shimada et al. .......... | 331/8 |
| 5,394,444 A | | 2/1995 | Silvey et al. ............. | 375/374 |
| 5,410,571 A | * | 4/1995 | Yonekawa et al. ........ | 375/376 |
| 5,448,598 A | * | 9/1995 | Yousefi et al. ............ | 375/376 |
| 5,463,329 A | | 10/1995 | Kawasaki et al. ......... | 326/77 |
| 5,570,042 A | | 10/1996 | Ma ........................... | 326/63 |

(Continued)

OTHER PUBLICATIONS

"Phase-Lock Loop Based (PLL) Clock Driver: A Critical Look at Benefits Versus Costs," Nagan Patel, SCAA033A, Texas Instruments, Mar. 1997.

(Continued)

*Primary Examiner*—Jean B. Corrielus
*Assistant Examiner*—Qutub Ghulamali

(57) ABSTRACT

A phase lock loop lock detect circuit determines whether an output signal of the phase lock loop is in phase-frequency synchronization with an input reference timing signal and provides an unlock alarm signal indicating that the output signal of a phase lock loop is no longer in phase-frequency synchronization with an input reference timing signal. The lock detection circuit has a first logic function circuit to combine a frequency increase signal and a frequency decrease signal of said phase lock loop to provide a frequency deviation signal. The first logic function in the preferred embodiment of this invention is an OR gate. The output of the first logic function circuit is an input to a second logic function circuit. The second logic function circuit combines the frequency deviation signal with the input reference signal, which is applied to a second input of the second logic function, to determine that the frequency deviation signal has a greater duration than a portion of a cycle of said input reference signal and provide an unlock alarm signal. The second logic function circuit in the preferred embodiment of this invention is an AND gate. The lock detection circuit further includes a latching circuit in communication with the second logic function and the input reference signal to capture and retain said unlock alarm signal indicating loss of phase-frequency lock of said phase lock loop.

32 Claims, 7 Drawing Sheets

U.S. PATENT DOCUMENTS

| | | | |
|---|---|---|---|
| 5,581,214 A | 12/1996 | Iga | 331/16 |
| 5,614,843 A | 3/1997 | Mita et al. | 326/73 |
| 5,673,004 A * | 9/1997 | Park | 331/1 A |
| 5,724,007 A | 3/1998 | Mar | 331/1 A |
| 5,793,225 A | 8/1998 | Gerson | 326/68 |
| 5,822,387 A | 10/1998 | Mar | 375/376 |
| 5,838,749 A | 11/1998 | Casper et al. | 375/376 |
| 5,870,002 A | 2/1999 | Ghaderi et al. | 331/17 |
| 5,886,582 A | 3/1999 | Stansell | 331/1 A |
| 5,889,437 A | 3/1999 | Lee | 331/16 |
| 5,905,386 A | 5/1999 | Gerson | 326/73 |
| 5,963,608 A * | 10/1999 | Casper et al. | 375/373 |
| 6,111,469 A | 8/2000 | Adachi | 331/17 |
| 6,215,834 B1 | 4/2001 | McCollough | 375/375 |
| 6,246,294 B1 | 6/2001 | Gai | 331/57 |
| 6,285,262 B1 | 9/2001 | Kuriyama | 331/25 |
| 6,674,824 B1 * | 1/2004 | Chiueh et al. | 375/376 |
| 6,760,394 B1 * | 7/2004 | Cao et al. | 375/374 |
| 6,785,354 B1 * | 8/2004 | Dietrich | 375/373 |
| 6,803,828 B1 * | 10/2004 | Tan et al. | 331/17 |
| 6,909,762 B1 * | 6/2005 | Cao et al. | 375/376 |
| 6,956,441 B1 * | 10/2005 | Matsumaru et al. | 331/1 A |
| 2001/0013800 A1 | 8/2001 | Wu et al. | 327/156 |

OTHER PUBLICATIONS

"Phase-Locked Loops for High-Frequency Receivers and Transmitters—Part 1," Curtin and O'Brian, *Analog Dialogue*, 33-3, 1999.

The TQ8103 Clock & Data Recovery (CDR) product description manufactured by Triquint Semiconductor Inc. of a monolithic CDR IC.

The AMCC S3040A Device Specification (Apr. 2, 2000) of a clock recovery unit.

\* cited by examiner

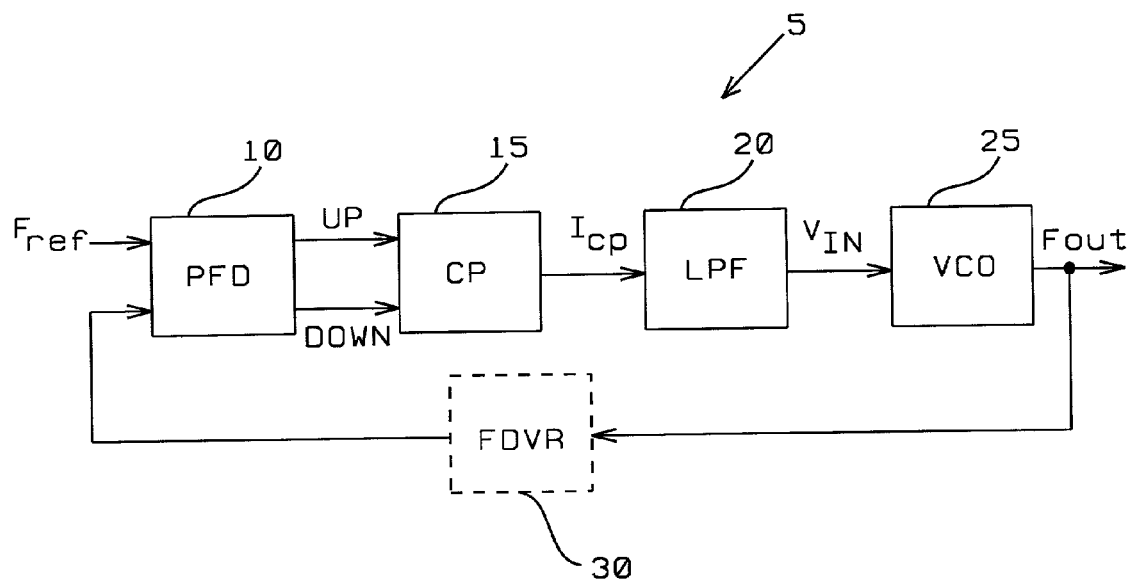
FIG. 1 – Prior Art
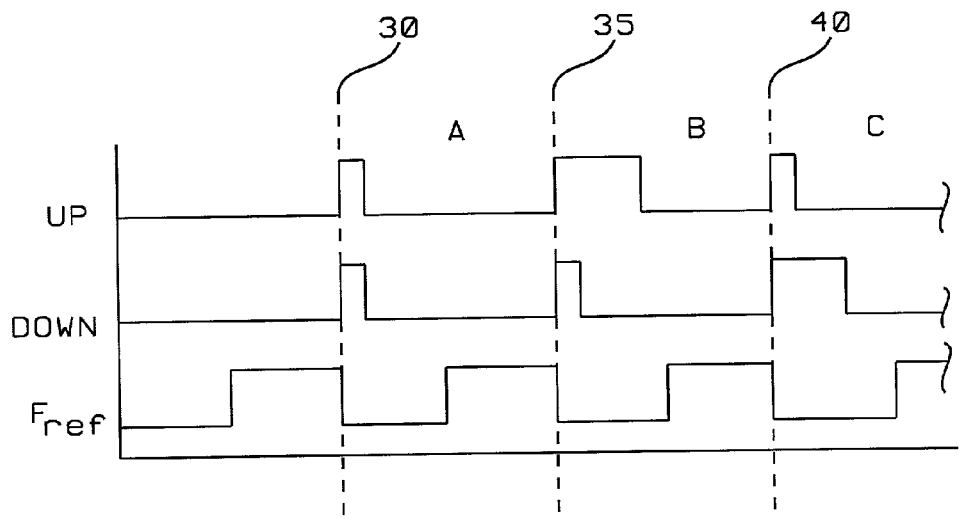
FIG. 2 – Prior Art

LOCK DETECTOR CIRCUIT FOR DEJITTER PHASE LOCK LOOP (PLL)

BACKGROUND OF THE INVENTION

1. Field of the Invention

This invention relates to phase and frequency synchronized oscillatory circuits such as a phase lock loop. More particularly, this invention relates to circuits that detect loss of phase and frequency synchronization of an output timing signal of a phase lock loop with its frequency reference signal and provide an alarm indicative of the loss of synchronization.

2. Description of Related Art

In present high frequency digital communication and telecommunications systems, the network terminals must provide timing signals that synchronize with the incoming transport signals to recover the information. An exemplary telecommunication system is the Synchronous Optical Network (SONET). SONET is a standard for optical transport formulated by the Exchange Carriers Standards Association (ECS) for the American National Standards Institute (ANSI). ANSI generally set the standards for telecommunication within the United States.

SONET as the name implies is a synchronous network thus requiring all terminals on a SONET network to have internal clocking that is traceable to a highly stable reference clocking supply. The reference timing of a network terminal is embedded in the transport signal and the receiver synchronizes its local oscillator to the incoming embedded reference timing signal. Alternately, each terminal maybe connected to a building integrated timing supply (BITS). BITS is a highly accurate oscillator signal transferred independently of the transport signal for each terminal to achieve synchronicity.

Each terminal has a receiver to receive and buffer the transport signal. The receiver is connected to a clock extraction circuit that extracts the reference timing signal from the transport signal. The clock extraction circuit is connected to a phase lock loop that generates the local timing signal for the terminal. Alternately, the phase lock loop is connected to a BITS clock extractor, which extracts the highly accurate reference timing signal from the BITS communication link.

Clock extraction from the transport signal is well known in the art as illustrated in U.S. Pat. No. 5,963,608 (Casper et al.). Casper et al. has a data rate estimator that derives an estimate of the data rate of data contained in the digital data signal. A frequency estimator derives an estimate of the frequency of the output of phase lock loop. During an initial frequency acquisition mode, the sweep controller sequentially varies an analog voltage applied to the voltage controlled oscillator of the phase lock loop, until the estimate of the data rate effectively corresponds to the estimate of the frequency of the output of the voltage controlled oscillator. This terminates the frequency acquisition mode and initiates a phase acquisition mode. A loop filter is swept until the frequency of the phase lock loop equal to the actual frequency of the embedded clock signal, thereby locking the loop to the embedded clock.

The structure of a phase lock loop is well known in the art as shown in "Phase-Lock Loop-Based (PLL) Clock Driver: A Critical Look at Benefits Versus Costs," Nayan Patel, SCAA033A, Texas Instruments, March 1997, and "Phase-Locked Loops for High-Frequency Receivers and Transmitters—Part 1" Curtin and O'Brien, *Analog Dialogue*, 33-3, 1999. Refer now to FIG. 1 for a brief review of the structure and operation of the phase lock loop. The key component of the phase lock loop 5 is a voltage controlled oscillator 25. The voltage controlled oscillator 25 may be crystal controlled oscillator (VCXO) or a surface acoustical wave (SAW) filter controlled oscillator (VCSO). The fundamental frequency of the voltage controlled oscillator as established by the crystal or SAW filter is adjusted or pulled in proportion to an input voltage signal $V_{IN}$. Thus the frequency of the output timing signal $F_{out}$ is modified in response to changes in the level of the input voltage signal $V_{IN}$. The input reference signal $F_{ref}$ is the timing reference signal either embedded in the transport signal or provided by the BITS. The phase-frequency detector 10 receives the input reference signal $F_{ref}$ and a feedback form of the output timing signal $F_{out}$. The input reference signal $F_{ref}$ and the feedback form of the output timing signal $F_{out}$ are compared to determine the phase and frequency equivalence of the input reference signal $F_{ref}$ and the feedback form of the output timing signal $F_{out}$. The phase-frequency detector 10 has an output UP indicating that the phase-frequency of the voltage control oscillator 25 needs to be adjusted to increase the frequency of the output timing signal $F_{out}$. The second output DOWN of the phase-frequency detector 10 indicated that the voltage controlled oscillator 25 needs to be adjusted to decrease the frequency of the output timing signal $F_{out}$. The output signal UP and DOWN of the phase-frequency detector 10 are the inputs to the charge pump 15. The charge pump 15 provides an output current $I_{CP}$ that is proportional to the desired frequency of the output timing signal $F_{out}$. The output current $I_{CP}$ is transferred to the low pass filter 20. The low pass filter 20 removes any undesired high frequency noise components that may be generated in the phase-frequency detector 15 or the charge pump 20 and creates the input adjustment voltage $V_{in}$ for the voltage controlled oscillator 25.

As is known in the art the frequency of the input reference signal $F_{ref}$ may be a submultiple of the frequency of the output timing signal $F_{out}$. If this is the case for the design of the phase lock loop as illustrated, the frequency divider 30 is optionally placed in the feedback path of the output timing signal $F_{out}$. The frequency divider divides the frequency of the output timing signal $F_{out}$ such that the input reference signal $F_{ref}$ is compared with a feedback signal that is a submultiple of the output timing signal $F_{out}$.

In digital phase lock loops the outputs UP and DOWN of the phase-frequency detector 10 are generally digital signals as shown in FIG. 2. In this example the phase frequency detector 10 determines phase and frequency synchronicity at the fall 30, 35, and 40 of the input reference signal. During the time period A, if the phase and frequency of the output timing signal $F_{out}$ and input reference signal $F_{ref}$ are aligned, the signal UP and the signal DOWN have an equal pulse width. As shown during time period B, if the phase of the output timing signal $F_{out}$ lags or the frequency is lower than the input reference signal $F_{ref}$, the signal UP has a pulse width longer than the signal DOWN. If the phase of the output timing signal $F_{out}$ leads or the frequency is higher than the input reference signal $F_{ref}$, the signal DOWN has a pulse width longer than the signal UP. The charge pump 15 responds appropriately to create the necessary current $I_{CP}$, which, when filtered, creates the input voltage $V_{IN}$ to adjust the voltage controlled oscillator 25.

Determination of phase-frequency lock of the phase lock loop 5 is important for the functioning of circuits that are to receive and extract the data from the transport signal. Generally, the circuits provide lock notification signals indicating that the phase lock loop is in phase-frequency synchronization. U.S. Pat. No. 6,215,834 (McCollough), U.S.

Pat. No. 5,886,582 (Stansell), U.S. Pat. No. 5,870,002 (Ghaderi et al.), U.S. Pat. No. 5,838,749 (Casper et al.), U.S. Pat. No. 5,822,387 (Mar), U.S. Pat. No. 5,724,007 (Mar), and U.S. Pat. No. 5,394,444 (Silvey et al.) are illustrative of circuits and systems that provide such notification of the phase-frequency synchronization. These notification signals provide only an indication of phase-frequency synchronization and do not indicate a loss of phase-frequency synchronization. However, U.S. Pat. No. 4,499,434 (Thompson) does provide an alarm indicating loss of the phase-frequency synchronization.

SUMMARY OF THE INVENTION

An object of this invention is to provide a circuit that determines whether an output signal of a phase lock loop is in phase-frequency synchronization with an input reference timing signal.

Another object of this invention is to provide a circuit that generates an unlock alarm signal indicating that an output signal of a phase lock loop is no longer in phase-frequency synchronization with an input reference timing signal.

To accomplish at least one of these and other objects, a lock detection circuit that is in communication with the phase lock loop has a first logic function circuit to combine a frequency increase signal and a frequency decrease signal of the phase lock loop to provide a frequency deviation signal. The first logic function in the preferred embodiment of this invention is an OR gate. The output of the first logic function circuit is an input to a second logic function circuit. The second logic function circuit combines the frequency deviation signal with the input reference signal, which is applied to a second input of the second logic function, to determine that the frequency deviation signal has a greater duration than a desired portion of a cycle of the input reference signal and provide an unlock alarm signal. The desired portion of a cycle of the input reference signal is proportionally related to the level of jitter tolerated between the input reference signal and the output timing signal. The second logic function circuit in the preferred embodiment of this invention is an AND gate.

The lock detection circuit further includes a latching circuit in communication with the second logic function and the input reference signal to capture and retain the unlock alarm signal indicating loss of phase-frequency lock of the phase lock loop. The unlock alarm signal is transferred to external circuitry such that the external circuit is alerted that data received from a network connection is no longer synchronized and may be corrupted.

In a second embodiment of the lock detection circuit, an integrator circuit replaces the latching circuit. The integrator circuit is in communication with the second logic function to receive and integrate the error signal. Upon the integrated error signal achieving an integrated threshold level, an unlock alarm is generated to indicate loss of phase-frequency lock of the phase lock loop.

In a third embodiment, the lock detection circuit further includes a frequency divider. The frequency divider is connected to receive the input reference signal, divide the input reference signal, and transfer the divided input reference signal to the second function circuit. The second logic function circuit combines the deviation signal and the divided input reference signal to generate the error signal.

An alternate embodiment of the lock detection circuit of this invention includes a phase-frequency detector. The phase-frequency detector is in communication with the phase lock loop to receive the output frequency signal and the input reference signal to generate a frequency increase signal and a frequency decrease signal. The frequency increase signal and the frequency decrease signal are indicative of an amount of phase-frequency deviation of the output frequency signal has from the input reference signal. The output of the phase frequency detector is applied to a first logic function circuit. The first logic function in this embodiment combines the frequency increase signal and the frequency decrease signal to provide a frequency deviation signal. The frequency deviation signal is combined with the input reference signal in a second logic function circuit to determine the frequency deviation signal. If the frequency deviation signal has a greater duration than the desired portion of a cycle of the input reference signal, the second logic function circuit provides the error signal.

BRIEF DESCRIPTION OF THE DRAWINGS

FIG. 1 is a functional block diagram of phase lock loop of the prior art.

FIG. 2 is plot of the outputs of the phase-frequency detector and the input reference signal of FIG. 1.

DETAILED DESCRIPTION OF THE INVENTION

As shown in FIG. 2, the output signals UP and DOWN of the phase frequency detector provides an indication of the deviation or jitter of the phase-frequency of the output timing signal $F_{out}$ of the voltage control oscillator from the input reference frequency signal $F_{ref}$. If the duration of the output signals UP or DOWN become too great, the output timing signal $F_{out}$ is said to no longer locked with the input reference frequency signal $F_{ref}$. The length of the duration of the output signals UP and DOWN that is allowable is a function of the level of the jitter that exists between the output timing signal $F_{out}$ and the input reference signal $F_{ref}$. Since there is no inherent signal within a phase lock loop to alert for excessive jitter or phase-frequency unlock, a circuit needs to added to the phase lock loop to provide the alarm of an unlock.

This alarm is used in telecommunication systems such a SONET to provide an alert to a receiver indicating the timing signal is not accurately recovered and the in coming data is corrupted. The SONET system then has extensive error correction and recovery techniques to insure accurate transfer of the communication signals.

Figure 3A:
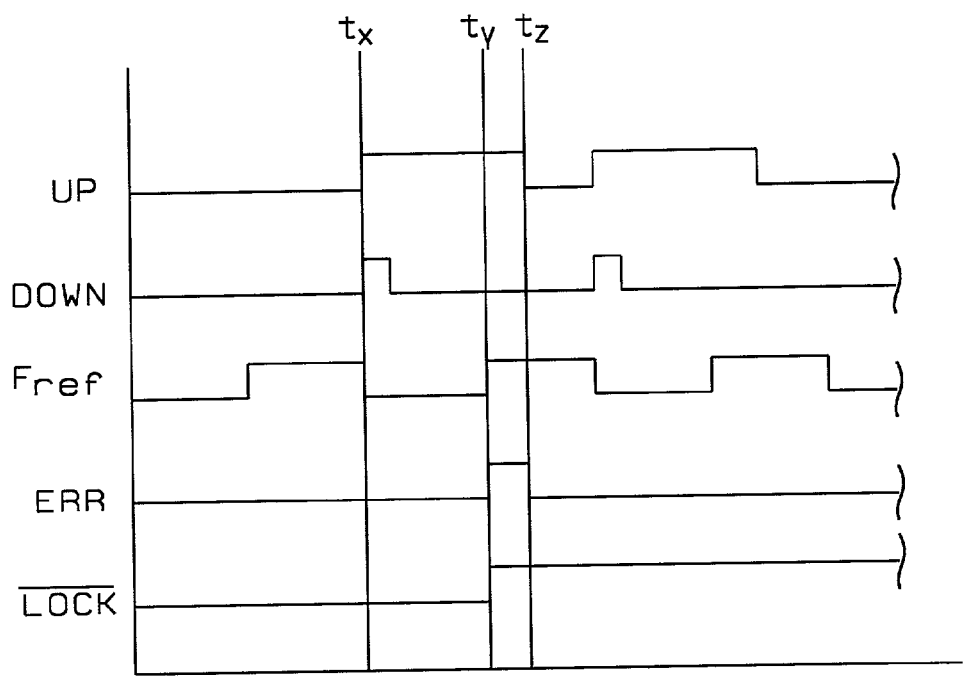
FIGS. 3a and 3b are plots of input signals and the unlock alarm signal of the lock detector circuit of this invention.
Figure 3B:
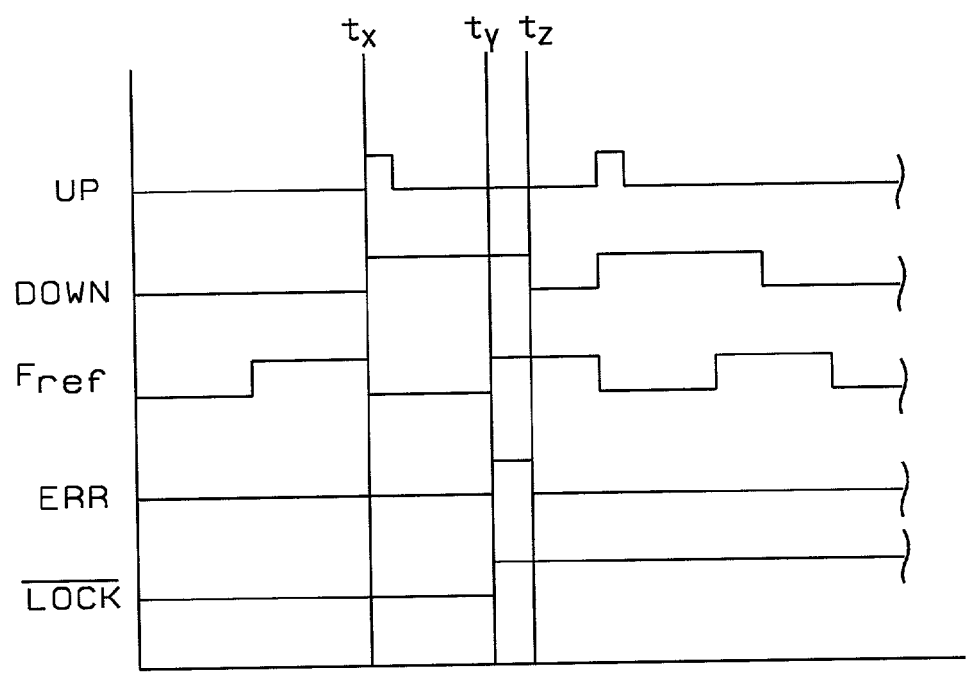

Referring now to FIGS. 3a and 3b for a discussion of lock detection in a phase lock loop of this invention. In FIG. 3a, the phase-frequency deviation is determined at the time $t_x$ and the UP signal is shown to extend longer than one-half cycle of the input reference signal $F_{ref}$. This indicates that the phase error of the output timing signal $F_{out}$ leads or has a higher frequency than the input reference signal $F_{ref}$. Alternately, in FIG. 3b, the phase-frequency deviation is determined at the time $t_X$ and the DOWN signal is shown to extend longer than one-half cycle of the input reference signal $F_{ref}$. This indicates that the phase error of the output timing signal $F_{out}$ lags or has a lower frequency than the input reference signal $F_{ref}$. If the amount of jitter or deviation of output timing signal $F_{out}$ causes the deviation signals UP or DOWN to extend beyond the time $t_Y$, the phase lock loop is considered to be no longer locked and, as described above, any received data is now corrupted. In a phase lock loop incorporating a lock detection circuit of this invention, an unlock alarm signal $\overline{LOCK}$ becomes active when either the UP or DOWN deviation signals extend greater than the time $t_Y$. The time $t_Y$ in this example is exactly one-half cycle of the input reference signal $F_{ref}$. However, as will be shown in subsequent embodiments the timing of the unlock alarm signal $\overline{LOCK}$ can be adjusted to account for differences in frequency deviation or jitter that can be tolerated in a communication system.

Figure 4:
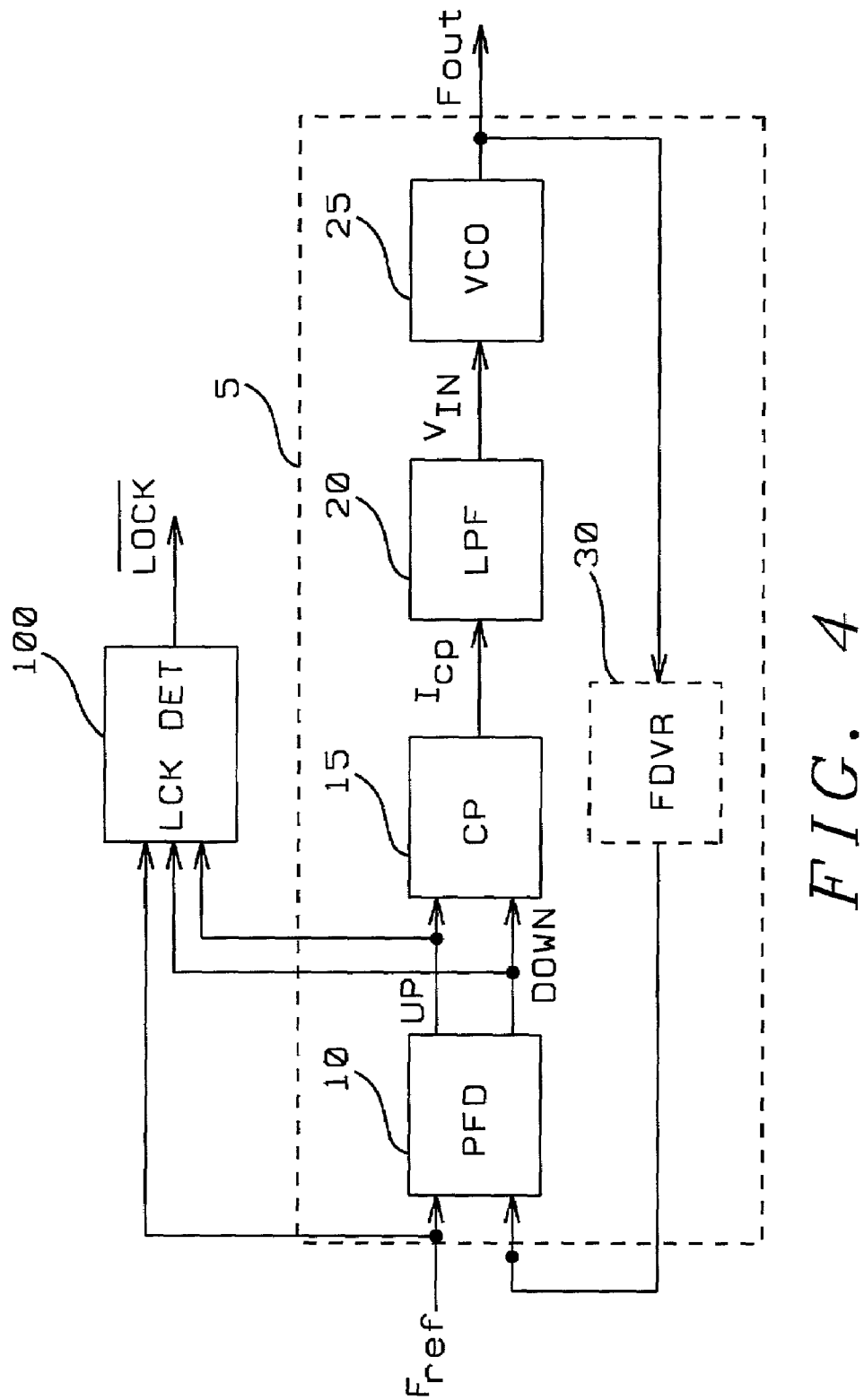
FIG. 4 is functional block diagram of a phase lock loop with an unlock detector of this invention.

FIG. 4 illustrates a first embodiment of a phase lock loop incorporating a lock detection circuit 100 of this invention. The structure and operation of the basic phase components of the phase lock loop 5 are as described for FIG. 1 The output of the phase-frequency detector UP and DOWN and the input reference signal $F_{ref}$ are the inputs to the lock detection circuit 100. The lock detection circuit 100 logically combines the output signals UP and DOWN to determine the amount of deviation that the output timing signal $F_{out}$ has versus the input reference signal $F_{ref}$. The amount of deviation is compared to the input reference signal $F_{ref}$ and as shown in FIGS. 3a and 3b, if the deviation is greater than one-half cycle of the input reference signal $F_{ref}$, the unlock alarm signal $\overline{LOCK}$ is set or latched at the time $t_Y$.

Figure 5:
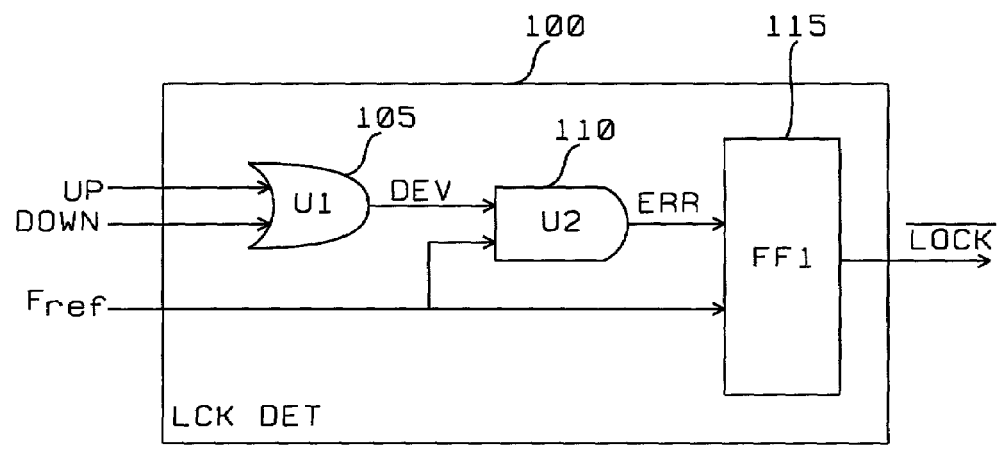
FIG. 5 is a logic diagram of a first embodiment of the lock detector circuit of this invention.

Refer now to FIG. 5 for a discussion of the structure and operation of the lock detection circuit 100. The output signals Up and DOWN of the phase-frequency detector 10 of FIG. 4 are logically combined in the OR gate 105 to form the deviation signal DEV. The deviation signal DEV and the input reference signal are logically combined by the AND gate 110 to form the error signal ERR. The error signal ERR, as shown in FIGS. 3a and 3b, becomes active at the time $t_Y$ and has a duration of from the time $t_Y$ to the time $t_Z$.

Ideally the error signal ERR would have sufficient duration to be interpreted by external circuitry as the unlock alarm signal $\overline{LOCK}$. However, in many instances, the duration of the error signal ERR maybe insufficient to be transferred for use by external circuitry of a communication system. To insure capture of the error signal ERR the lock detection circuit may optionally include a latch or flip-flop FF1 115. The error signal ERR is the set input of the latch 115 and the input reference signal $F_{ref}$ is the clock input of the latch 115. As shown in FIGS. 3a and 3b, at the rising edge of the input reference signal $F_{ref}$, the latch 115 captures and retains the error signal ERR to create the unlock alarm signal $\overline{LOCK}$. The latch is intended to be provided by the external circuitry as part of the recognition of the loss of lock condition, therefore reset for the latch 115 is provided by the external circuitry.

Figure 6:
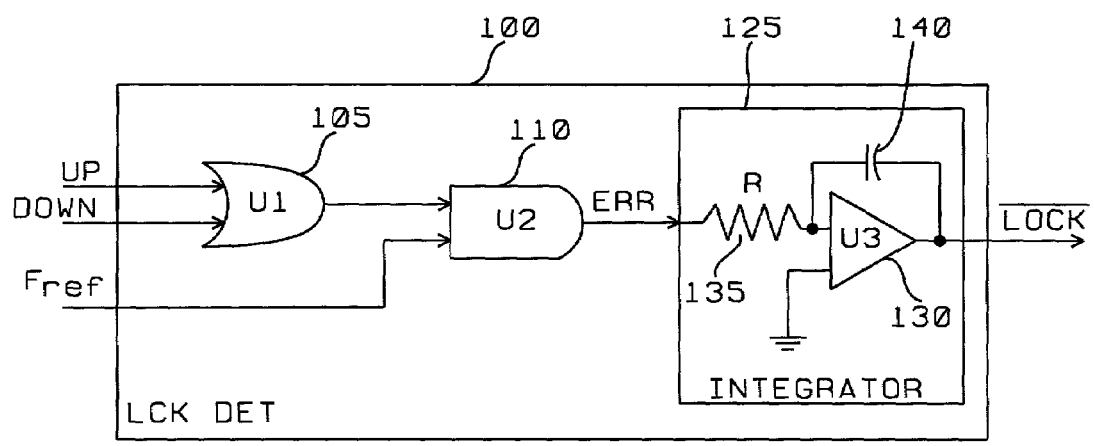
FIG. 6 is a logic diagram of a second embodiment of the lock detector circuit of this invention.

A second embodiment of the lock detection circuit of this invention is shown in FIG. 6. In this embodiment the latch 115 of FIG. 5 is substituted with an integrator 125. The integrator 125 receives the error signal ERR and integrates the signal to form the unlock alarm signal $\overline{LOCK}$. In this instance the integrator 125 is structured such that the energy present in the error signal ERR determines the output level of the unlock alarm signal $\overline{LOCK}$. The integrator is designed such that the deviation or jitter of the output timing signal $F_{out}$ versus the input reference signal $F_{ref}$ is set to any desired amount of deviation or jitter.

The integrator 125 has differential amplifier 130, a resistor 135, and a capacitor 140. The structure and operation is well known in the art and will not be discussed further. The output voltage of the differential amplifier 130 is the unlock alarm signal $\overline{LOCK}$ and is equal to $$V_{unlck} = \frac{1}{RC} \int V_{err} dt$$

where:
$V_{unlck}$ is the magnitude as a function of time of the unlock alarm signal $\overline{LOCK}$.
$V_{ERR}$ is the magnitude as a function of time of the error signal ERR.
R is the resistance of the resistor 135.
C is the capacitance of the capacitor 140.

In this embodiment the unlock alarm signal $\overline{LOCK}$ is received by a Schmidt trigger or comparator to assure appropriate logic level for the external circuitry. In practical terms, the unlock alarm signal $\overline{LOCK}$ is transferred to a latch or D-type flip-flop with an external reset that has sufficient hysteresis to trigger the unlock alarm signal $\overline{LOCK}$ correctly.

Figure 7:
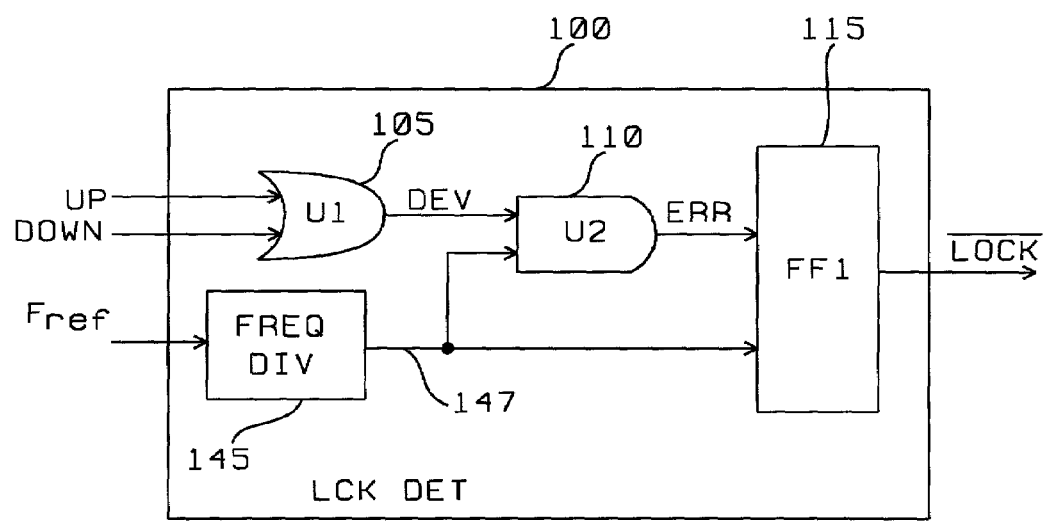
FIG. 7 is a logic diagram of a third embodiment of the lock detector circuit of this invention.

FIG. 7 is an illustration of a third embodiment of the lock detection circuit incorporated in the phase lock loop of this invention. In this instance the lock detection circuit is structured and operates as described in FIG. 5 except in this instance the level of jitter is greater than the one-half cycle as shown in FIG. 5. To accomplish this the input reference frequency $F_{ref}$ is applied to a frequency divider 145. The output of the frequency divider 145 is now the input to the AND gate 110 to be combined with the deviation signal DEV to form the error signal ERR. As described for the error signal ERR of FIG. 5, the error signal ERR may be transferred directly to the external circuitry. However, it is likely that the duration of the error signal ERR may be insufficient for use by the external circuitry and must be captured and retained as described above in the latch 115.

It would be obvious to one skilled in the art that the integrator 125 of FIG. 6 could be substituted for the latch 115 and still be in keeping with the intent of this invention. The integrator would function as described for FIG. 6 except the timing would be determined by the divided input reference frequency signal 147.

Figure 8:
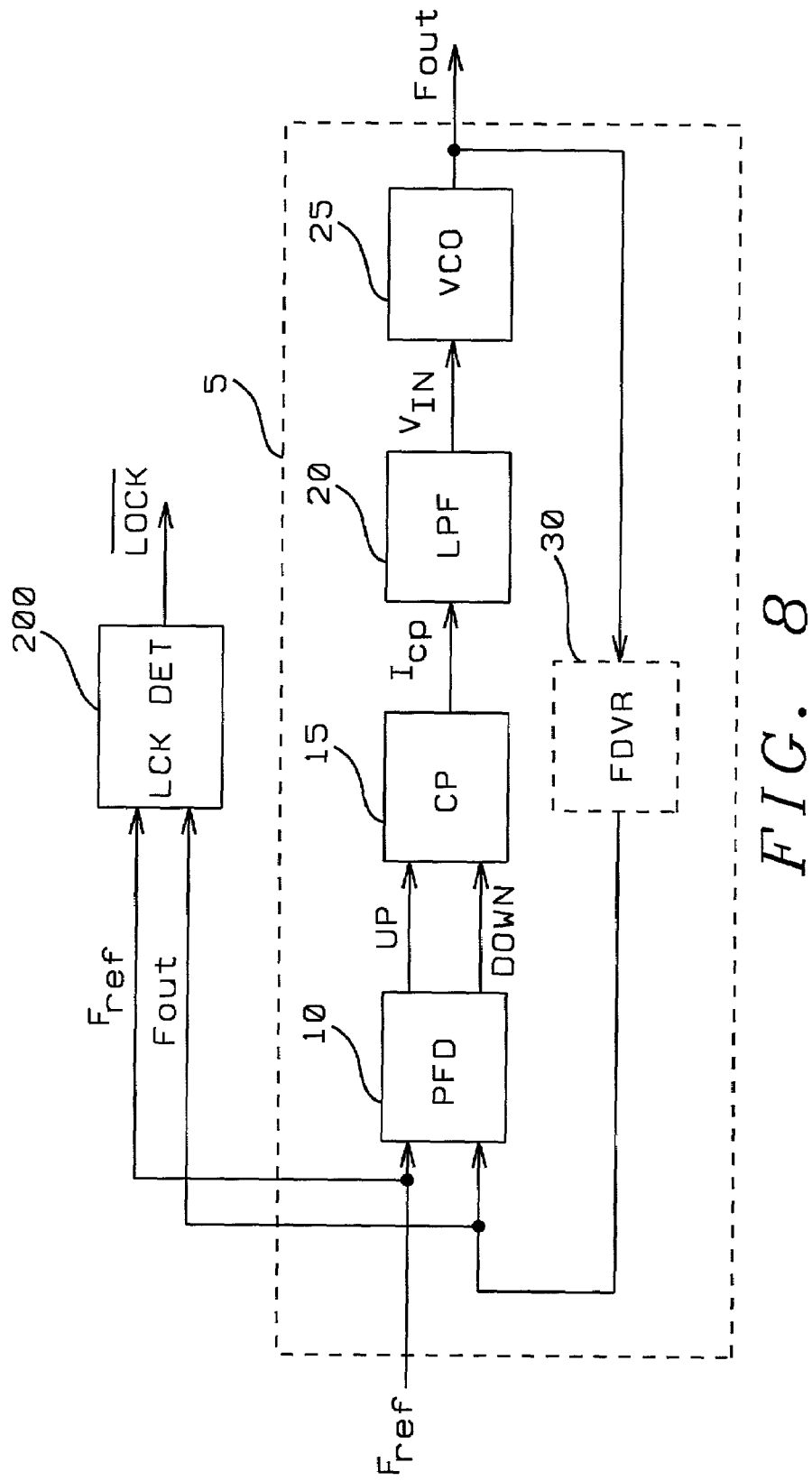
FIG. 8 is functional block diagram of an alternate embodiment of a phase lock loop with an unlock detector of this invention.

Referring now to FIG. 8 for a discussion of a fourth embodiment of the lock detection circuit incorporated in a phase lock loop of this invention. The phase lock loop 5 is structure and functions as described for FIG. 1. The lock detection circuit 200 in this embodiment has the output timing signal $F_{out}$ and the input reference signal $F_{ref}$ as inputs. The phase-frequency deviation is directly determined and the unlock alarm signal $\overline{LOCK}$ is activated when the phase-frequency deviation between the output timing signal $F_{out}$ and the input reference signal $F_{ref}$ is greater than an amount allowed for application of the phase lock loop.

Figure 9:
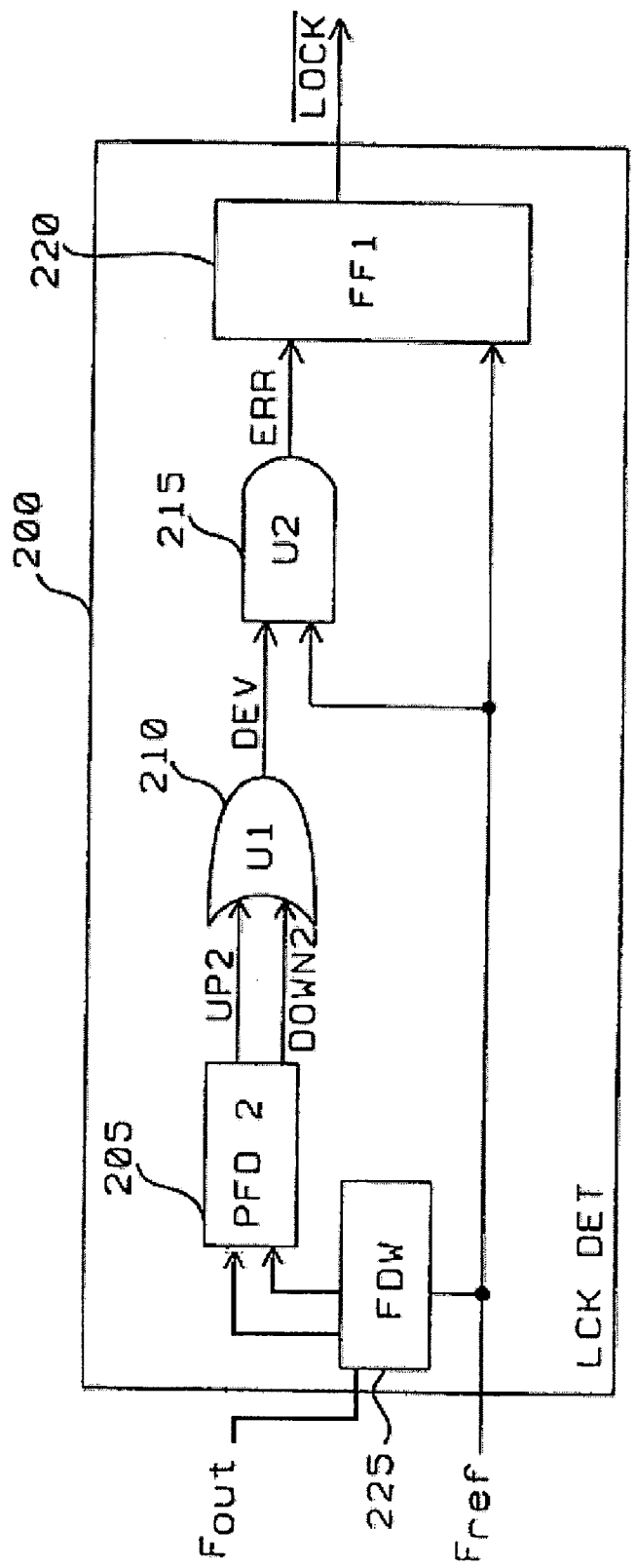
FIG. 9 is a logic diagram of a fourth embodiment of the lock detector circuit of this invention.

The lock detection circuit 200, as shown in FIG. 9 is fundamentally as structure in FIG. 5, except in this embodiment, the output timing signal $F_{out}$ is an input to the frequency divider circuit 225, and the reference signal $F_{ref}$ is an input to the frequency divider circuit 225. The frequency divided signals from the frequency divider circuit 225 are applied to a separate phase-frequency detector 205. The separate phase-frequency detector 205 functions at a different frequency than the phase-frequency detector 10 of FIG. 8. The proportionality of the duration of the deviation output signals UP 2 and DOWN 2 of the phase-frequency detector 205 versus the input reference signal $F_{ref}$ is used to determine the amount of deviation or jitter that the phase lock loop can accept before activating the unlock alarm signal $\overline{LOCK}$. The deviation output signals UP 2 and DOWN 2 are logically combined in the OR gate 210 to form the deviation signal DEV. The deviation signal DEV and the input reference signal $F_{ref}$ are logically combined in the AND gate 215 to form the error signal ERR. The error signal ERR may be transferred to external circuitry or may be captured and retained in the latch 220 as described above.

As is known in the art, the function of a phase lock loop maybe accomplished as a process within a computation device such as a microcomputer, microcontroller, or digital signal processor. Similarly, the lock detection circuit of this invention can be accomplished as a process within the process of the phase lock loop.

The method for providing an unlock alarm that denotes loss of phase frequency synchronism of a phase lock loop begins by providing an increase frequency signal and a decrease frequency signal from the phase lock loop generation process. The increase and decrease frequency signals indicate existence of an error in the phase-frequency between an input reference timing signal to the phase lock loop and an output local oscillator signal. A first logical combining of the increase frequency signal and the decrease frequency signal is performed to create a phase-frequency deviation signal. In the preferred embodiment of this method, this first logical combining is an ORing of increase and decrease frequency signals A second logical combining of the phase-frequency deviation signal and the input reference timing signal is then performed. In the preferred embodiment of this invention, the second logical combining is an ANDing of the phase-frequency deviation signal and the input reference timing signal. If the phase-frequency deviation signal has a greater duration than a portion of a cycle of the timing signal, the unlock alarm signal is provided. Since the duration of the unlock alarm signal maybe small, the method may include a capturing and retaining of the unlock alarm signal for transfer to external circuitry.

An alternate to the capturing and retaining the unlock alarm signal is executed in a second embodiment of the method of this invention by integrating the unlock alarm signal. A threshold at which the unlock alarm signal is deemed to be critical to the reception of incoming data is set and the unlock alarm signal is then transferred to an external process for recovery of any lost data.

A third embodiment of the method of this invention divides the frequency of the input reference signal by a factor sufficient to establish the level of jitter or phase-frequency difference to be tolerated by the communication system. Subsequent to the dividing of the input reference signal the second logical combining of the deviation signal now occurs with the divided input reference signal. While the dividing factor for the input reference signal maybe any real number, for practical purposes the factor is an integer that adjusts the rising edge relative of the divided input reference signal relative to the allowable jitter.

In a fourth embodiment of the method of this invention, the increase and decrease frequency signals are derived independently from the input reference signal and the output timing signal of the phase lock loop. The derivation is a result of the comparison of the phase-frequency of the output timing signal to the input reference signal and providing an indication of phase lead of the output timing signal and the input reference signal (greater frequency) or of phase lag (lower frequency). The extent of the difference in the output timing signal and the input reference signal are shown as the magnitude and duration of the increase and decrease frequency signals and are adjusted by improving the sensitivity of the comparison of the phase-frequency of the output timing signal with the input reference signal.

While this invention has been particularly shown and described with reference to the preferred embodiments thereof, it will be understood by those skilled in the art that various changes in form and details may be made without departing from the spirit and scope of the invention.

The invention claimed is:

1. A lock detection circuit in communication with a phase lock loop to detect phase-frequency lock of an output frequency signal of said phase lock loop with an input reference signal, comprising:
   a first logic function circuit to combine a frequency increase signal and a frequency decrease signal of said phase lock loop to provide a frequency deviation signal;
   a second logic function circuit to combine the frequency deviation signal with the input reference signal to determine that the frequency deviation signal has a greater duration than a portion of a cycle of said input reference signal and provide an error signal; and
   an integrator circuit in communication with the second logic function to receive and integrate the error signal and upon the error signal achieving an integrated threshold level, transferring an unlock alarm indicating loss of phase-frequency lock of said phase lock loop.

2. The lock detection circuit of claim 1 further comprising a frequency divider connected to receive the input reference signal, divide said input reference signal, and transfer the divided input reference signal to the second function circuit, wherein said second logic function circuit combines the deviation signal and the divided input reference signal to generate the error signal.

3. The lock detection circuit of claim 1 wherein the first logic function circuit is an OR gate.

4. The lock detection circuit of claim 1 wherein the second logic function circuit is an AND gate.

5. A lock detection circuit for communication with a phase lock loop to detect phase-frequency lock of an output frequency signal of said phase lock loop with an input reference signal to said phase lock loop, wherein said phase lock loop includes a first phase-frequency detector, a charge pump responsive to said first phase-frequency detector, and a variable oscillator responsive to said charge pump, wherein said first phase-frequency detector is coupled to receive a first input proportional to said output frequency signal and a second input proportional to said reference signal to generate a first frequency increase signal and a first frequency decrease signal indicative of an amount of phase-frequency deviation of said first and second input signals, said lock detection circuit comprising:
   a second phase-frequency detector coupled to receive a third input proportional to said output frequency signal and a fourth input proportional to said reference signal to generate a second frequency increase signal and a second frequency decrease signal indicative of an amount of phase-frequency deviation of said third and fourth inputs;
   a first logic function circuit connected to the second phase frequency detector to combine said second frequency increase signal and said second frequency decrease signal to provide a frequency deviation signal; and a second logic function circuit to combine the frequency deviation signal with a clocking signal proportional to the input reference signal to determine that the frequency deviation signal has a greater duration than a portion of a cycle of said clocking signal and provide an error signal.

6. The lock detection circuit of claim 5 wherein the first logic function circuit is an OR gate.

7. The lock detection circuit of claim 5 wherein the second logic function circuit is an AND gate.

8. The lock detection circuit of claim 5 further having a frequency divider with a frequency-dividing input coupled to receive said first input to said first phase-frequency detector, and having a frequency-dividing output coupled to said third input of said second phase-frequency detector.

9. The lock detection circuit of claim 5 further having a frequency divider with a frequency-dividing input coupled to receive said second input to said first phase-frequency detector, and having a frequency-dividing output coupled to said fourth input of said second phase-frequency detector.

10. A phase lock loop system comprising:
a phase lock loop having a first phase-frequency detector and a variable oscillator responsive to said first phase-frequency detector for producing an output frequency signal, wherein said first phase-frequency detector is coupled to receive a first input proportional to said output frequency signal and a second input proportional to a reference signal to generate a first frequency increase signal and a first frequency decrease signal indicative of an amount of phase-frequency deviation of said first and second input signals; and
a lock detection circuit to detect loss of phase-frequency lock of the output frequency signal of said phase lock loop with the input reference signal and upon detection of said loss of phase-frequency lock provide an unlock alarm, said lock detection circuit comprising:
a second phase-frequency detector coupled to receive a third input proportional to said output frequency signal and a fourth input proportional to said reference signal to generate a second frequency increase signal and a second frequency decrease signal indicative of an amount of phase-frequency deviation of said third and fourth inputs;
a first logic function circuit to combine said second frequency increase signal and said second frequency decrease signal to provide a frequency deviation signal; and
a second logic function circuit to combine the frequency deviation signal with a clocking signal proportional to the input reference signal to determine that the frequency deviation signal has a greater duration than a portion of a cycle of said clocking signal and provide said unlock alarm.

11. The phase lock loop of claim 10 wherein the lock detection circuit further comprises a latching circuit in communication with the second logic function to capture and retain said unlock alarm to provide an unlock alarm signal indicating loss of phase-frequency lock of said phase lock loop.

12. The phase lock loop of claim 10 wherein the lock detection circuit further comprises a frequency divider connected to receive the input reference signal, divide said input reference signal, and transfer the divided input reference signal to the second function circuit, wherein said second logic function circuit combines the deviation signal and the divided input reference signal to generate the error signal.

13. The phase lock loop of claim 10 wherein the first logic function circuit is an OR gate.

14. The phase lock loop of claim 10 wherein the second logic function circuit is an AND gate.

15. The lock detection circuit of claim 10 further having a frequency divider with a frequency-dividing input coupled to receive said first input to said first phase-frequency detector, and having a frequency-dividing output coupled to said third input of said second phase-frequency detector.

16. The lock detection circuit of claim 10 further having a frequency divider with a frequency-dividing input coupled to receive said second input to said first phase-frequency detector, and having a frequency-dividing output coupled to said fourth input of said second phase-frequency detector.

17. A phase lock loop system comprising:
a phase-frequency detector to detect a difference in frequency between an output frequency of said chase lock loop and an input reference frequency of said phase lock loop; and
a lock detection circuit to detect loss of phase-frequency lock of the output frequency signal of said phase lock loop with the input reference signal and upon detection of said loss of phase-frequency lock provide an unlock alarm, said lock detection circuit comprising:
a first logic function circuit to combine a frequency increase signal and a frequency decrease signal received from said phase-frequency detector to provide a frequency deviation signal; and
a second logic function circuit to combine the frequency deviation signal with the input reference signal to determine that the frequency deviation signal has a greater duration than a portion of a cycle of said input reference signal and provide said unlock alarm;
wherein the lock detection circuit further comprises an integrator circuit in communication with the second logic function to receive and integrate the error signal and upon the error signal achieving an integrated threshold level, transferring an unlock alarm indicating loss of phase-frequency lock of said phase lock loop.

18. A clock extraction circuit to provide an alarm indicating that a local oscillator signal is no longer in phase-frequency synchronism with an reference timing signal extracted from a data stream, said clock extraction circuit comprises:
a clock extractor to remove said timing signal from said data stream;
a phase lock loop in communication with the clock extractor to receive said timing signal and adjust a phase and frequency of the local oscillator signal synchronize said local oscillator signal to the timing signal; and
a lock detection circuit to detect loss of phase-frequency lock of the local oscillator signal with the timing signal and upon detection of said loss of phase-frequency lock provide an unlock alarm, said lock detection circuit comprising:
a first logic function circuit to combine a frequency increase signal and a frequency decrease signal received from said phase lock loop to provide a frequency deviation signal, and
a second logic function circuit to combine the frequency deviation signal with the timing signal to determine that the frequency deviation signal has a greater duration than a portion of a cycle of said timing signal and provide said unlock alarm;

wherein the lock detection circuit further comprises an integrator circuit in communication with the second logic function to receive and integrate the error signal and upon the error signal achieving an integrated threshold level, transferring an unlock alarm indicating loss of phase-frequency lock of said phase lock loop.

19. The clock extractor of claim 18 wherein the lock detection circuit further comprises a frequency divider connected to receive the input reference signal, divide said input reference signal, and transfer the divided input reference signal to the second function circuit, wherein said second logic function circuit combines the deviation signal and the divided input reference signal to generate the error signal.

20. The clock extractor of claim 18 wherein the first logic function circuit is an OR gate.

21. The clock extractor of claim 18 wherein the second logic function circuit is an AND gate.

22. A synchronous communication system for the transfer of a synchronous transport signal, comprising:
   synchronous transmission apparatus to combine a data signal and a timing reference signal to form the synchronous transport signal; and
   synchronous communication receiver apparatus in communication with the synchronous transmission apparatus to receive the synchronous transport signal band to extract said data and the reference timing signal, comprising:
   a receiver to receive and buffer said synchronous transport signal,
   a clock extraction circuit in communication with the receiver to receive the synchronous transport signal and to provide an alarm indicating that a local oscillator signal is no longer in phase-frequency synchronism with the reference timing signal extracted from a synchronous transport signal, said clock extraction circuit comprises:
   a clock extractor to remove said timing signal from said synchronous transport signal,
   a phase lock loop in communication with the clock extractor to receive said reference timing signal and adjust a phase and frequency of the local oscillator signal synchronize said local oscillator signal to the timing signal, and
   a lock detection circuit to detect loss of phase-frequency lock of the local oscillator signal with the timing signal and upon detection of said loss of phase-frequency lock provide an unlock alarm, said lock detection circuit comprising:
   a first logic function circuit to combine a frequency increase signal and a frequency decrease signal received from said phase lock loop to provide a frequency deviation signal, and
   a second logic function circuit to combine the frequency deviation signal with the timing signal to determine that the frequency deviation signal has a greater duration than a portion of a cycle of said timing signal and provide said unlock alarm.

23. The synchronous communication system of claim 22 wherein the lock detection circuit further comprises a latching circuit in communication with the second logic function and the input reference signal to capture and retain said unlock alarm to provide an unlock alarm signal indicating loss of phase-frequency lock of said phase lock loop.

24. The synchronous communication system of claim 22 wherein the lock detection circuit further comprises an integrator circuit in communication with the second logic function to receive and integrate the error signal and upon the error signal achieving an integrated threshold level, transferring an unlock alarm indicating loss of phase-frequency lock of said phase lock loop.

25. The synchronous communication system of claim 22 wherein the lock detection circuit further comprises a frequency divider connected to receive the input reference signal, divide said input reference signal, and transfer the divided input reference signal to the second function circuit, wherein said second logic function circuit combines the deviation signal and the divided input reference signal to generate the error signal.

26. The synchronous communication system of claim 22 wherein the first logic function circuit is an OR gate.

27. The synchronous communication system of claim 22 wherein the second logic function circuit is an AND gate.

28. The synchronous communication system of claim 22 wherein said synchronous communication system is a SONET communication system.

29. A synchronous communication system for the transfer of a synchronous transport signal, comprising:
   a synchronous transmission apparatus to combine a data signal and a timing reference signal to form the synchronous transport signal;
   a synchronous communication receiver apparatus in communication with the synchronous transmission apparatus to receive the synchronous transport signal band to extract said data and the reference timing signal, comprising:
   a receiver to receive and buffer said synchronous transport signal,
   a clock extraction circuit in communication with the receiver to receive the synchronous transport signal and to provide an alarm indicating that a local oscillator signal is no longer in phase-frequency synchronism with the reference timing signal extracted from a synchronous transport signal, said clock extraction circuit comprises:
   a clock extractor to remove said timing signal from said synchronous transport signal,
   a phase lock loop in communication with the clock extractor to receive said reference timing signal and adjust a phase and frequency of the local oscillator signal synchronize said local oscillator signal to the timing signal; and
   a lock detection circuit to detect loss of phase-frequency lock of the local oscillator signal with the timing signal and upon detection of said loss of phase-frequency lock provide an unlock alarm, said lock detection circuit comprising:
   a phase-frequency detector in communication with the phase lock loop to receive the output frequency signal and the input reference signal to generate a frequency increase signal and a frequency decrease signal indicative of an amount of phase-frequency deviation of the output frequency signal has from the input reference signal,
   a first logic function circuit connected to the phase frequency detector to combine a frequency increase signal and a frequency decrease signal to provide a frequency deviation signal, and
   a second logic function circuit to combine the frequency deviation signal with the timing signal to determine that the frequency deviation signal has a greater duration than a portion of a cycle of said timing signal and provide said unlock alarm.

30. The synchronous communication system of claim 29 wherein the first logic function circuit is an OR gate.

31. The synchronous communication system of claim 29 wherein the second logic function circuit is an AND gate.

32. The synchronous communication system of claim 29 wherein said synchronous communication system is a SONET communication system.

* * * * *

UNITED STATES PATENT AND TRADEMARK OFFICE
CERTIFICATE OF CORRECTION

| | | |
|---|---|---|
| PATENT NO. | : 7,082,178 B2 | |
| APPLICATION NO. | : 10/016915 | |
| DATED | : July 25, 2006 | |
| INVENTOR(S) | : David Meltzer | |

It is certified that error appears in the above-identified patent and that said Letters Patent is hereby corrected as shown below:

Title Page,

Item [54], change "LOCK DETECTOR CIRCUIT FOR DEJITTER PHASE LOCK LOOP (PLL)" to -- LOCK DETECTOR CIRCUIT FOR DEJITTER PHASE LOCK LOOP (PLL) APPLICATIONS--.

Column 10,
Line 19, change "said chase" to --said phase--.

Signed and Sealed this

Twelfth Day of December, 2006

JON W. DUDAS
*Director of the United States Patent and Trademark Office*